(12) United States Patent
Shim

(10) Patent No.: US 7,361,542 B2
(45) Date of Patent: Apr. 22, 2008

(54) METHOD OF FABRICATING CMOS IMAGE SENSOR

(75) Inventor: Hee Sung Shim, Seoul (KR)

(73) Assignee: Dongbu Electronics Co., Ltd, Seoul (KR)

( * ) Notice: Subject to any disclaimer, the term of this patent is extended or adjusted under 35 U.S.C. 154(b) by 275 days.

(21) Appl. No.: 11/319,065

(22) Filed: Dec. 28, 2005

(65) Prior Publication Data

US 2006/0141692 A1   Jun. 29, 2006

(30) Foreign Application Priority Data

Dec. 29, 2004  (KR)  .................... 10-2004-0114779
Dec. 29, 2004  (KR)  .................... 10-2004-0114780

(51) Int. Cl.
*H01L 21/8238* (2006.01)

(52) U.S. Cl. .................... 438/200; 438/199; 257/204

(58) Field of Classification Search ............... 257/204, 257/274; 438/153, 188, 199–233
See application file for complete search history.

*Primary Examiner*—Carl Whitehead, Jr.
*Assistant Examiner*—Sonya D. McCall-Shepard
(74) *Attorney, Agent, or Firm*—McKenna Long & Aldridge LLP

(57) ABSTRACT

A method of fabricating a CMOS image sensor can minimize a dark current by avoiding a dry etch process of a photodiode surface. The method can also reduce a contact resistance and variation of the contact resistance of a readout circuit unit within a unit pixel. The method includes steps of forming an insulating layer on a semiconductor substrate divided into a photodiode area and a transistor area, removing the insulating layer on a gate electrode forming area, forming a gate insulating layer, forming a conductive layer, forming a gate electrode by planarizing the conductive layer, selectively removing the insulating layer to expose the semiconductor substrate, forming a lightly doped impurity region in the exposed semiconductor substrate, forming a spacer on a sidewall of the gate electrode, completely removing the insulating layer, and forming a heavily doped impurity region on the transistor area of the semiconductor substrate.

12 Claims, 10 Drawing Sheets

US 7,361,542 B2

METHOD OF FABRICATING CMOS IMAGE SENSOR

This application claims the benefit of Korean Patent Application No. 10-2004-0114779, filed on Dec. 29, 2004 and Korean Patent Application No. 10-2004-0114780, filed on Dec. 29, 2004, which is hereby incorporated by reference for all purposes as if fully set forth herein.

BACKGROUND OF THE INVENTION

1. Field of the Invention

The present invention relates to a CMOS image sensor, and more particularly, to a method of fabricating a CMOS image sensor. Although the present invention is suitable for a wide scope of applications, it is particularly suitable for minimizing a dark current by minimizing a photodiode surface damage. The present invention is also suitable for reducing a contact resistance and a variation of the contact resistance of a read-out circuit within a unit pixel by uniformly forming salicide on an active area and on a gate electrode, except for a photodiode region.

2. Discussion of the Related Art

Generally, an image sensor is a semiconductor device that converts an optical image to an electric signal. Image sensors are mainly classified into a charge coupled device (CCD) and a CMOS (complementary metal oxide silicon) image sensor.

A general CCD has a complicated drive system, needs considerable power consumption, and requires a multi-step photo process. Hence, it is disadvantageous in that a process of fabricating the general CCD is complicated. Moreover, in the CCD, it is difficult to integrate a control circuit, a signal processing circuit, an analog/digital (A/D) converter, etc. on a CCD chip. Hence, it is difficult to reduce a size of the CCD. However, a CMOS image sensor has been given attention as a next generation image sensor that can overcome the disadvantages of the CCD.

In the CMOS image sensor, MOS transistors that correspond to the number of unit pixels are formed on a semiconductor substrate by CMOS technology using a control circuit, a signal processing circuit, etc. as peripheral circuits. Hence, the CMOS image sensor adopts a switching system that sequentially detects outputs of the unit pixels via the MOS transistors.

Using CMOS fabrication technology, the CMOS image sensor is advantageous as it requires low power consumption, has a simple fabricating process due to a small number of photo process steps. Since a control circuit, a signal processing circuit, an analog/digital (A/D) converter, etc. can be integrated on a CMOS image sensor chip, a reduced size of the CMOS image sensor may be facilitated. Hence, the CMOS image sensors are widely used in various application fields such as digital still cameras, digital video cameras, etc.

A related art CMOS image sensor is explained in detail with reference to FIG. 1 and FIG. 2 as follows. FIG. 1 is a layout of the unit pixel of a 4T type CMOS image sensor and FIG. 2 is a diagram of an equivalent circuit 100 of a unit pixel of the CMOS image sensor shown in FIG. 1.

Referring to FIG. 1, an active area 10 is defined in a unit pixel of a general 4T type CMOS image sensor. One photodiode (PD) 20 is formed on a wide region of the active area 10 and gate electrodes 110, 120, 130 and 140 of four transistors are overlapped with the rest of the active area 10. The gate electrode 110 configures a transfer transistor Tx. The gate electrode 120 configures a reset transistor Rx. The gate electrode 130 configures a drive transistor Dx. The gate electrode 140 configures a select transistor Sx.

The active area 10 of each of the transistors except the portion overlapped with the corresponding gate electrode 110, 120, 130 or 140, is doped with impurity ions to become source/drain regions of each of the transistors. Hence, a power source voltage Vdd is applied to the source/drain regions between the reset and drive transistors Rx and Dx, and a power source voltage Vss is applied to the source/drain region of the select transistor Sx. FIG. 2 shows an additional part FD of the equivalent circuit 100.

A method of fabricating a related art CMOS image sensor is explained with reference to FIGS. 3A to 3C as follows. FIGS. 3A to 3C are cross-sectional diagrams of the CMOS image sensor taken along a cutting line I-I' shown in FIG. 1.

Referring to FIG. 3A, a lightly doped p type (p$^-$) epitaxial layer 2 is formed on a p type semiconductor substrate 1. A trench is then formed by etching the epitaxial layer 2 in a device isolation area to a predetermined depth by photolithography using a mask defining an active area and the device isolation area. An oxide layer is formed on the epitaxial layer 2. Chemical mechanical polishing is performed on the oxide layer to fill the trench. Hence, a device isolation layer 3 is formed in the device isolation area.

A gate insulating layer 4 and a conductive layer are sequentially stacked over the substrate and are then selectively removed to form a gate insulating layer 4 and a gate electrode 5 on a transistor area. The conductive layer, and therefore the gate electrode 5, may be made of polysilicon.

Referring to FIG. 3B, a salicide blocking insulating layer 6 is deposited over the semiconductor substrate. A photoresist layer 7 is formed on the insulating layer 6. The photoresist layer 7 is patterned by exposure and development to cover a photodiode area. In particular, the photoresist pattern 7 covers the photodiode area and exposes a portion of the salicide blocking insulating layer 6 on the gate electrode 5. The exposed salicide blocking insulating layer 6 on the gate electrode 5 is selectively removed. The salicide blocking insulating layer 6 may be made of TEOS.

Referring to FIG. 3C, the photoresist pattern 7 is removed. Then, a salicide layer 8 is formed on an exposed surface of the gate electrode 5.

However, in the related art salicide forming method of the CMOS image sensor, a surface of the photodiode area is damaged by the etch process used to form the gate electrode from the conductive layer, or the etch process used to form a spacer from the insulating layer. The damage includes a crystalline defect generated from the photodiode surface. Hence, a dark current is generated.

Moreover, in the related art CMOS image sensor fabricating method, a salicide blocking mask is extended to prevent salicidation from occurring on the photodiode. Hence, salicide and no-salicide co-exist in the gate electrode and the active area configuring the read-out circuit of the pixel unit. This raises contact resistance. Further, an etching undercut of the salicide blocking insulating layer is inevitable due to the characteristics of a wet etch process. The undercut etch varies according to a location within a wafer. This variation changes contact resistance as well.

SUMMARY OF THE INVENTION

Accordingly, the present invention is directed to a method of fabricating a CMOS image sensor that substantially obviates one or more problems due to limitations and disadvantages of the related art.

An advantage of the present invention is to provide a method of fabricating a CMOS image sensor, by which a dark current is minimized by avoiding a dry etch process of a photodiode surface.

An advantage of the present invention is to provide a method of fabricating a CMOS image sensor, by which contact resistance and variation of the contact resistance of a read-out circuit unit within a unit pixel can be reduced.

Additional features and advantages of the invention will be set forth in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the present invention, as embodied and broadly described, a method of fabricating a CMOS image sensor includes the steps of forming an insulating layer on a first conductive type semiconductor substrate divided into a photodiode area and a transistor area, removing the insulating layer on a gate electrode forming area of the transistor area, forming a gate insulating layer on the gate electrode forming area of the semiconductor substrate, forming a conductive layer over the semiconductor substrate, forming a gate electrode by planarizing the conductive layer to expose a surface of the insulating layer, selectively removing the insulating layer to expose the semiconductor substrate, forming a second conductive type lightly doped impurity region in the exposed semiconductor substrate, forming a spacer on a sidewall of the gate electrode, completely removing the insulating layer, and forming a second conductive type heavily doped impurity region on the transistor area of the semiconductor substrate by ion implantation using a mask.

In another aspect of the present invention, a method of fabricating a CMOS image sensor includes the steps of forming an insulating layer on a first conductive type semiconductor substrate divided into a photodiode area and a transistor area, removing the insulating layer on a gate electrode forming area of the transistor area, forming a gate insulating layer on the gate electrode forming area of the semiconductor substrate, forming a conductive layer over the semiconductor substrate, forming a gate electrode by planarizing the conductive layer to expose a surface of the insulating layer, selectively removing the insulating layer to expose the semiconductor substrate, forming a second conductive type lightly doped impurity region in the exposed semiconductor substrate, forming a spacer on a sidewall of the gate electrode, forming a second conductive type heavily doped impurity region on the semiconductor substrate using the gate electrode and the spacer as a mask, forming a salicide on a surface of the gate electrode and an exposed epitaxial layer of an active area, and completely removing the insulating layer.

In another aspect of the present invention, a method of fabricating a CMOS image sensor includes the steps of forming an insulating layer on a first conductive type semiconductor substrate divided into a photodiode area and a transistor area, removing the insulating layer on a gate electrode forming area of the transistor area, forming a gate insulating layer on the gate electrode forming area of the semiconductor substrate, forming a conductive layer over the semiconductor substrate, forming a gate electrode by planarizing the conductive layer to expose a surface of the insulating layer, completely removing the insulating layer, forming a second conductive type lightly doped impurity region on an exposed transistor area of the semiconductor substrate, forming a spacer on a sidewall of the gate electrode, forming a second conductive type heavily doped impurity region on the semiconductor substrate using the gate electrode and the spacer as a mask, forming a salicide on a surface of the gate electrode and an exposed epitaxial layer of an active area, and forming a second conductive type impurity region and a first conductive type impurity region in the photodiode area by ion implantation using a mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principle of the invention. In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or similar parts.

FIGS. 4A to 4J are cross-sectional diagrams of a CMOS image sensor fabricated by a method of fabricating a CMOS image sensor according to an exemplary embodiment of the present invention.

Figure 1:
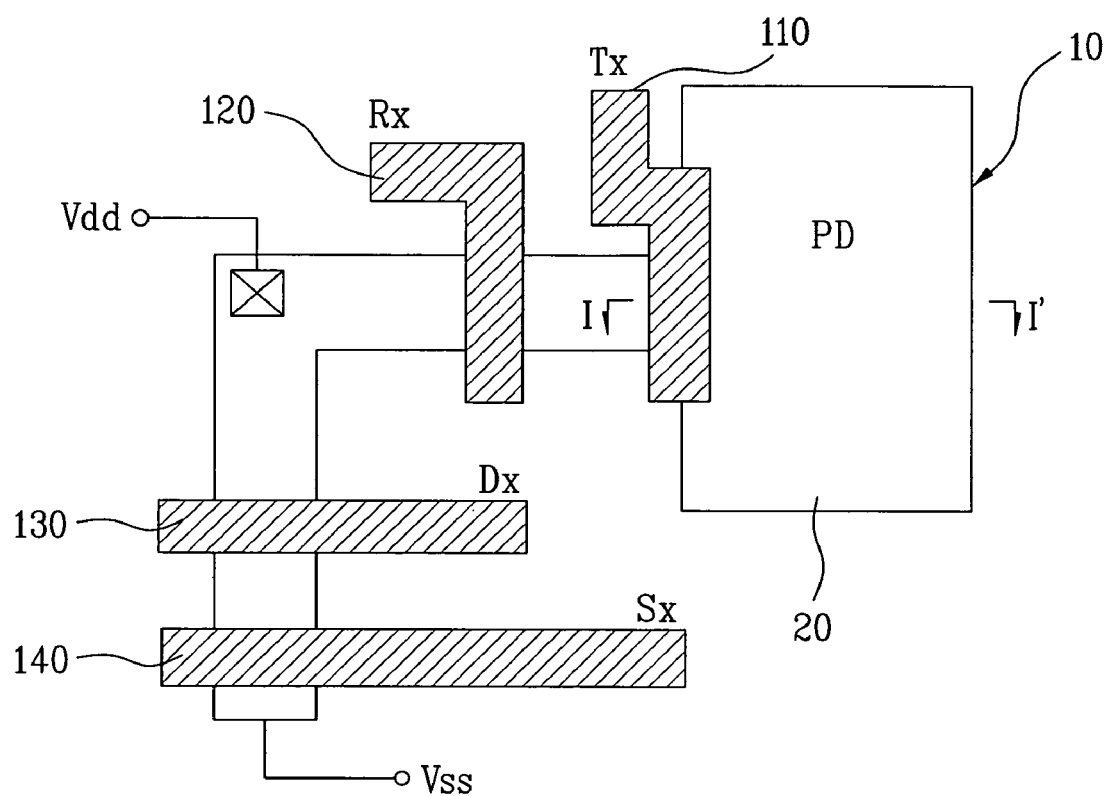
FIG. 1 is a layout of a unit pixel of a 4T type CMOS image sensor according to a related art.
Figure 2:
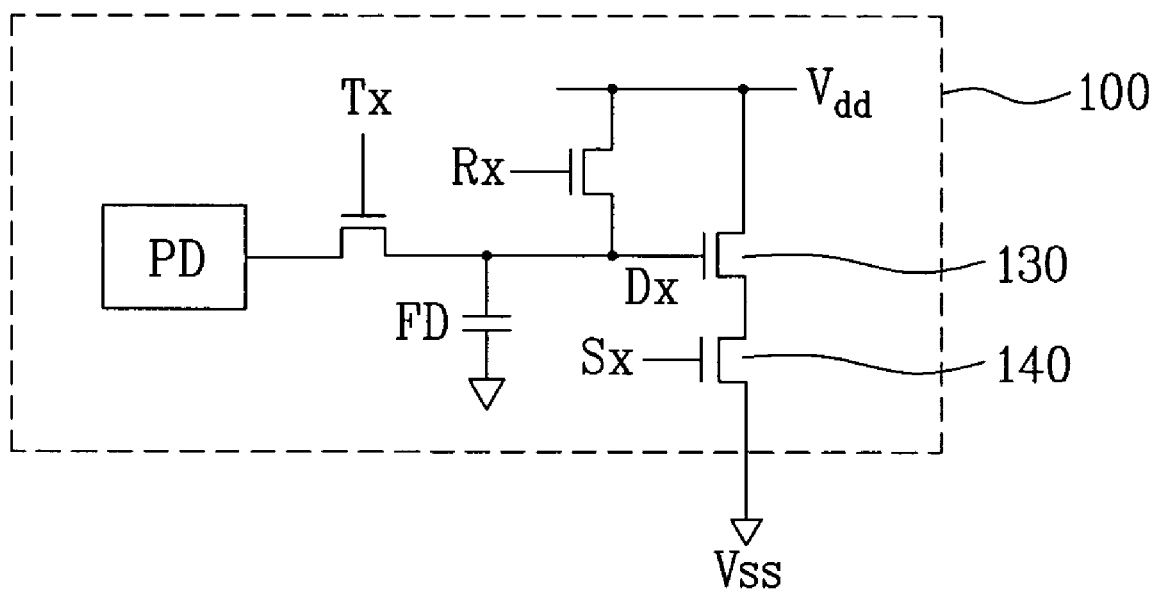
FIG. 2 is an equivalent circuit diagram of the CMOS image sensor shown in FIG. 1.
Figure 3A:
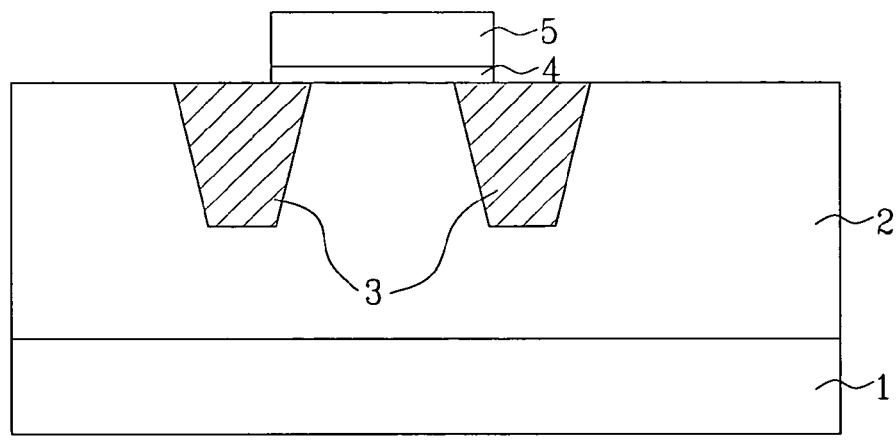
FIGS. 3A to 3C are cross-sectional diagrams of a CMOS image sensor fabricated by a method of fabricating a CMOS image sensor according to a related art.
Figure 3B:
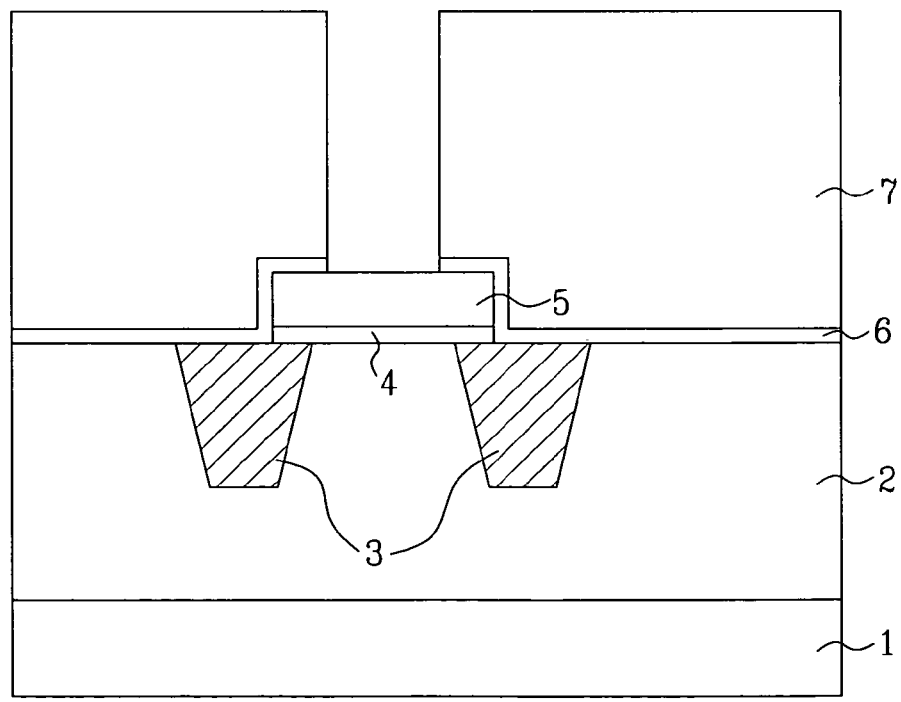
Figure 3C:
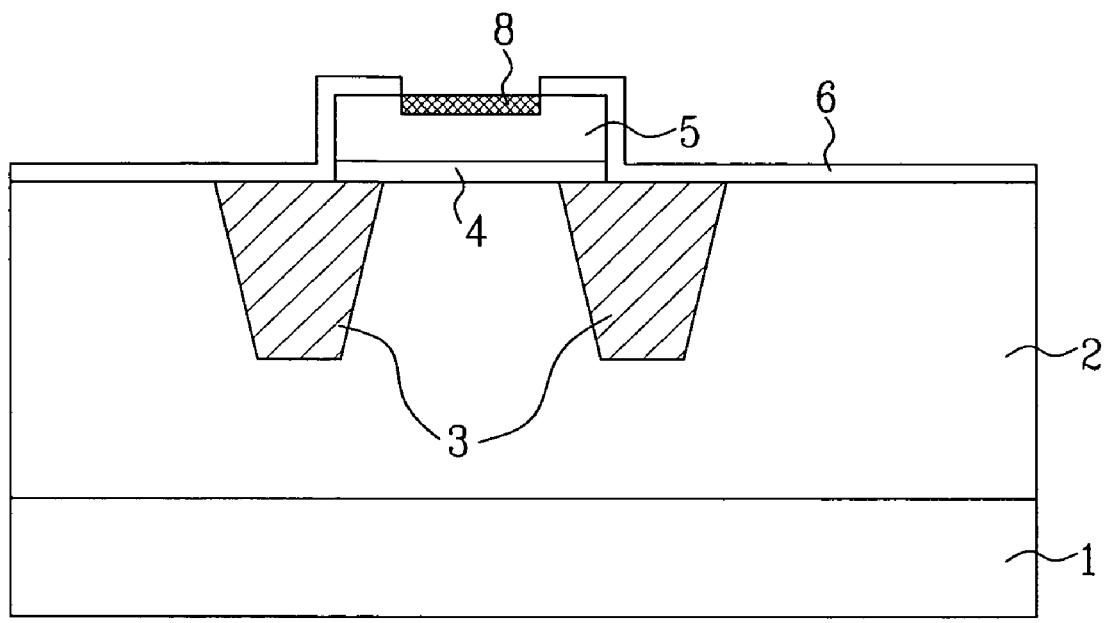
Figure 4A:
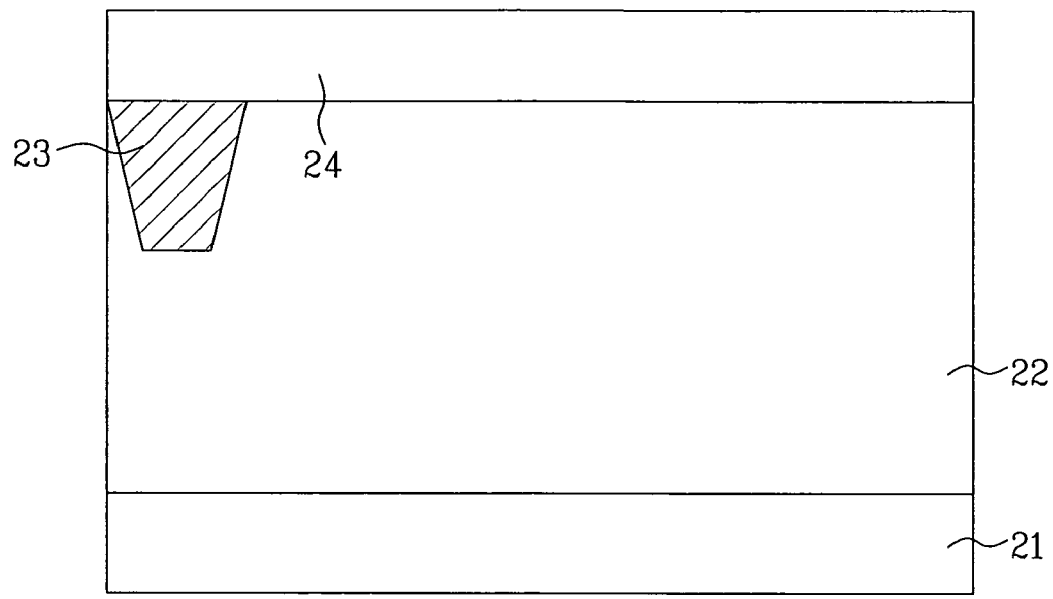
FIGS. 4A to 4J are cross-sectional diagrams of a CMOS image sensor fabricated by a method of fabricating a CMOS image sensor according to an exemplary embodiment of the present invention.

Referring to FIG. 4A, a lightly doped p type (P⁻) epitaxial layer 22 is formed on a p type semiconductor substrate 21. A trench is then formed by etching the epitaxial layer 22 in a device isolation area to a predetermined depth by photolithography using a mask defining an active area and the device isolation area. An oxide layer is formed on the epitaxial layer 22. Chemical mechanical polishing is performed on the oxide layer to fill the trench. Hence, a device isolation layer 23 is formed in the device isolation area. An insulating layer 24, such as an oxide layer, a nitride layer, etc. is formed over the semiconductor substrate including the device isolation layer 23. Preferably, the insulating layer 24 is formed of a TEOS based oxide layer.

Figure 4B:
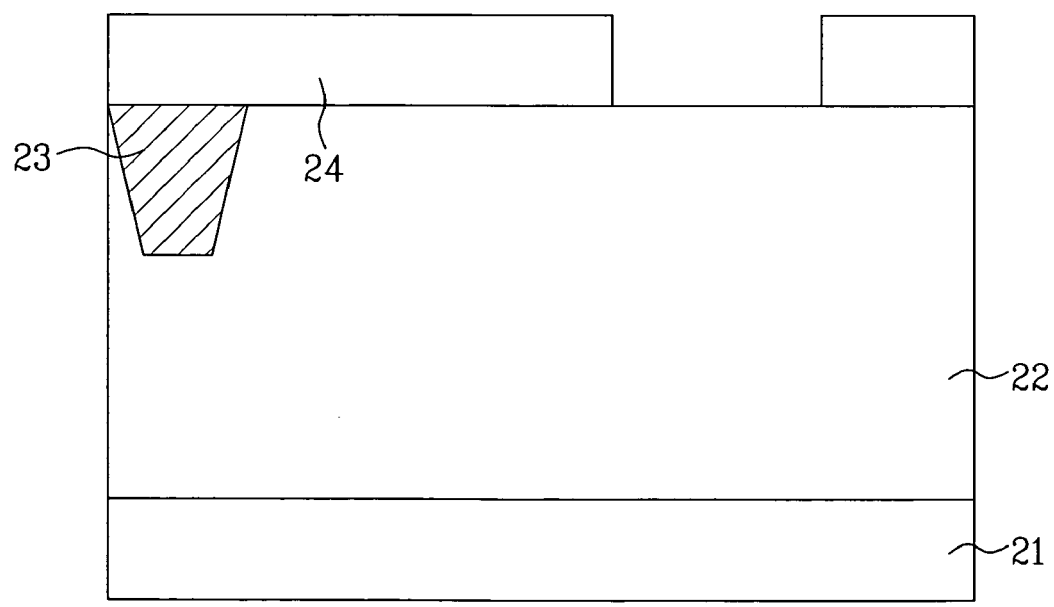

Referring to FIG. 4B, a portion of the insulating layer 24 is removed from a gate electrode forming area by photolithography using a gate electrode pattern mask of each transistor.

Figure 4C:
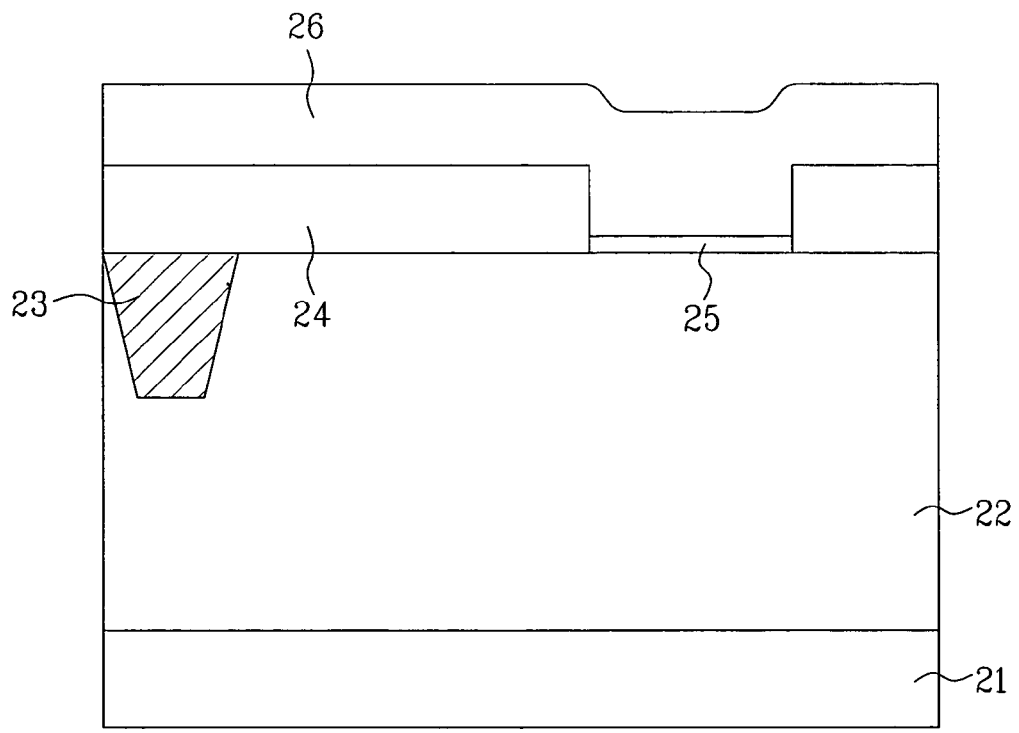

Referring to FIG. 4C, a gate oxide layer 25 may be formed on the epitaxial layer 22 of the gate electrode forming area by oxidation. A conductive layer 26, which may be polysilicon, is then deposited over the semiconductor substrate including the gate oxide layer 25.

Figure 4D:
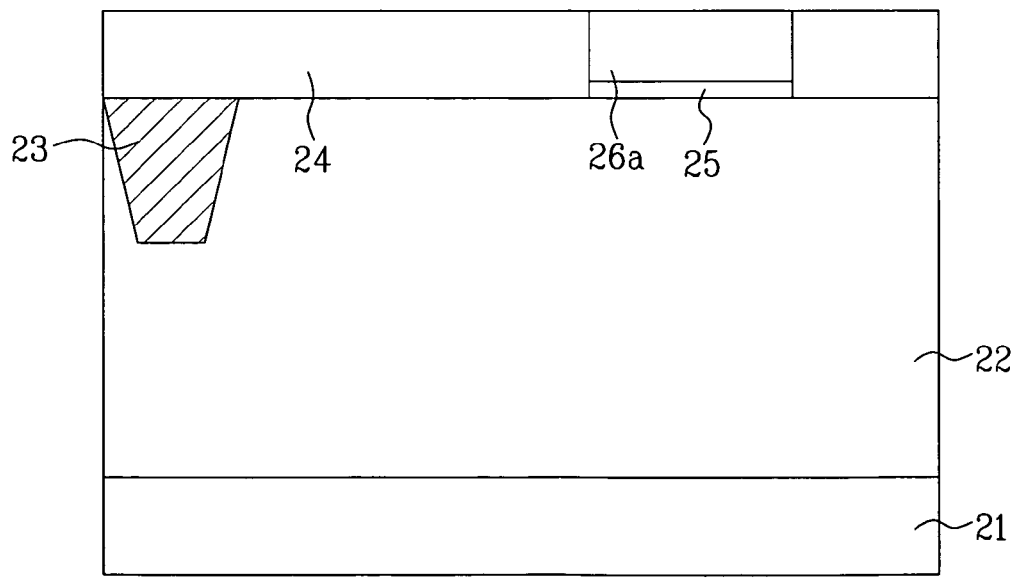

Referring to FIG. 4D, the polysilicon layer 26 may be planarized by chemical mechanical polishing to expose a surface of the insulating layer 24. Hence, gate electrodes 26a of a transfer transistor, a reset transistor, a drive transistor and a select transistor are formed, respectively. In an exemplary embodiment, since the insulating layer 24 is formed on a photodiode forming area, the photodiode forming area is not directly exposed in the process of forming the gate electrodes 26a. Hence, a surface of the photodiode forming area can be protected.

Figure 4E:
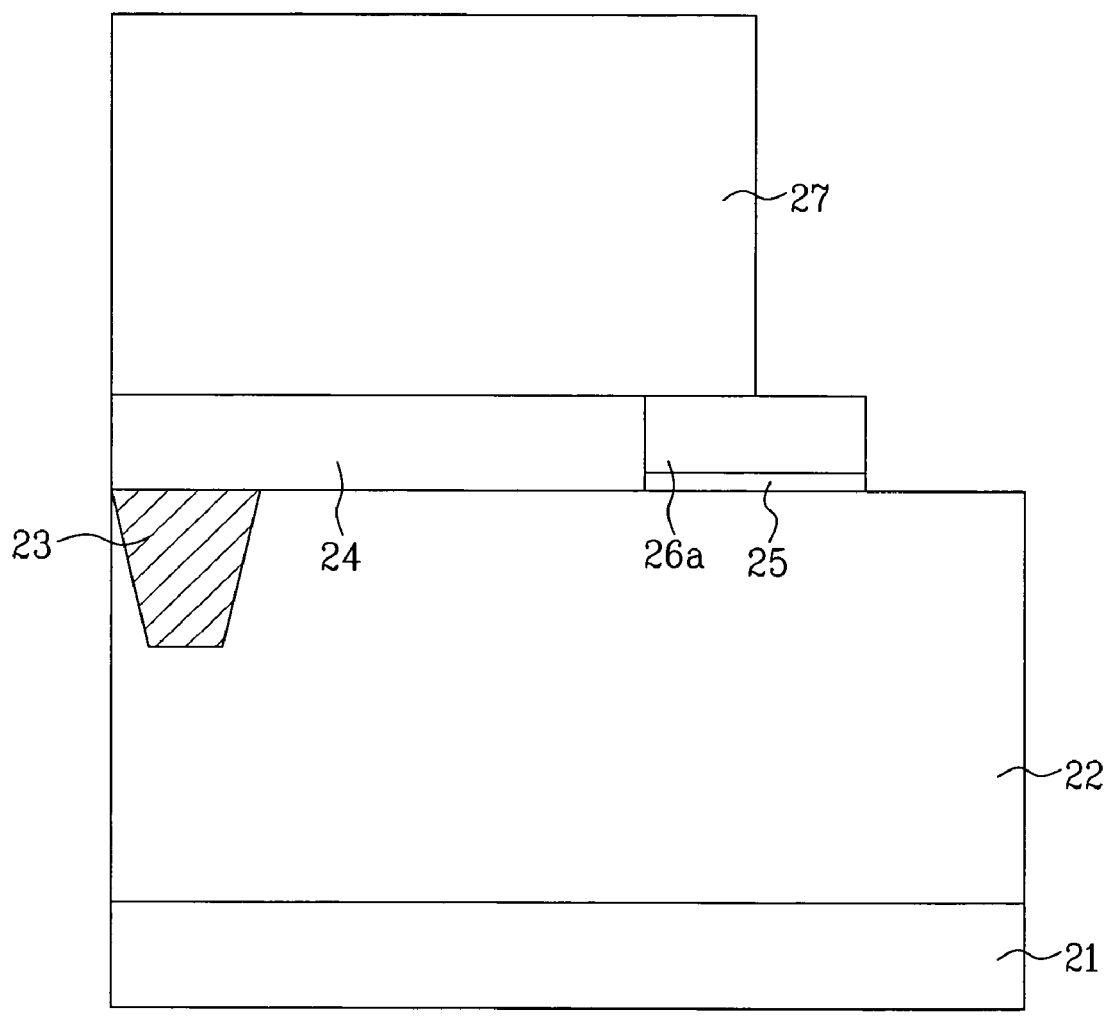

Referring to FIG. 4E, a photoresist layer 27 is formed over the semiconductor substrate. The photoresist layer 27 is then patterned by exposure and development to remain over the photodiode forming area only. A portion of the insulating layer 24 failing to be covered with the patterned photoresist layer 27 is removed by a wet etch process or a dry etch process.

Figure 4F:
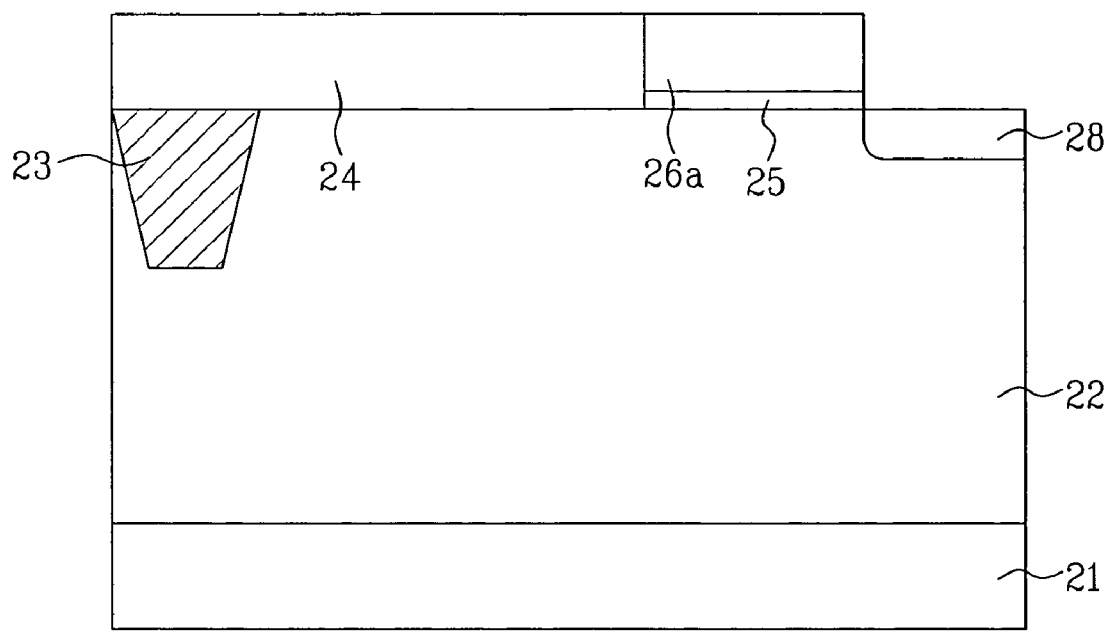

Referring to FIG. 4F, impurity ions are implanted into the epitaxial layer 22 of the transistor forming area to form a lightly doped n type impurity region 28. The photoresist layer 27 is then removed.

Figure 4G:
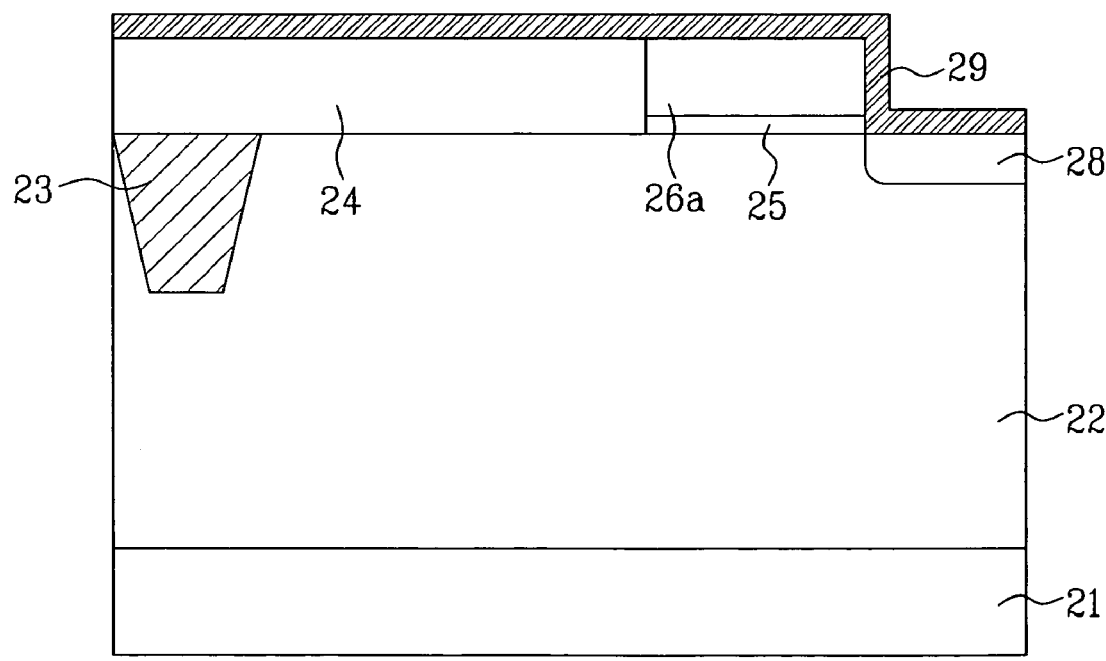

Referring to FIG. 4G, in order to form a spacer on a sidewall of the gate electrodes 26a of the transistors, an insulating layer 29, such as a nitride layer, an oxide layer, etc. is deposited over the semiconductor substrate.

Figure 4H:
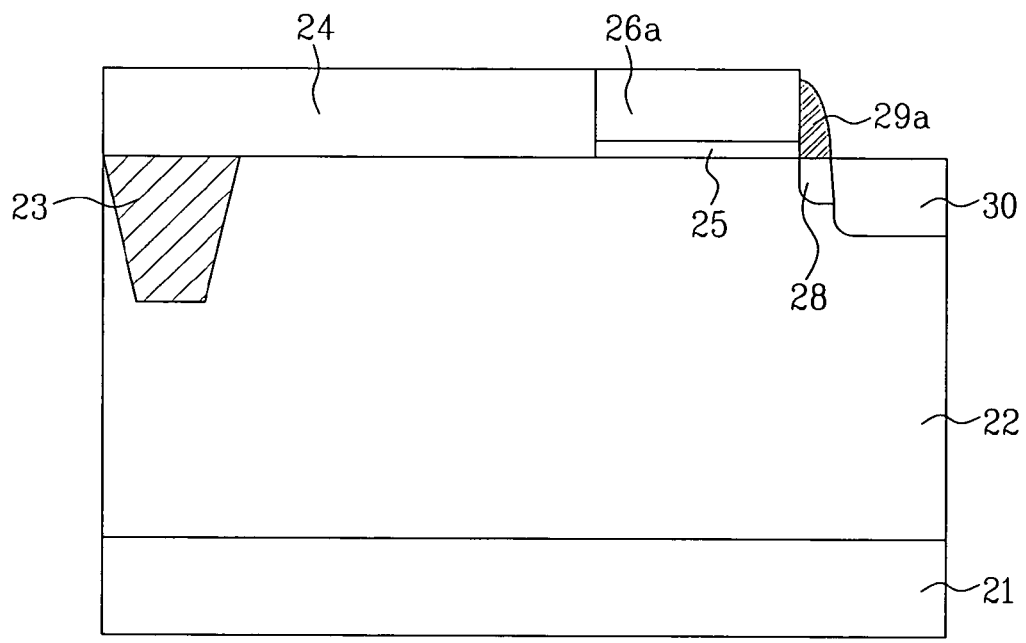

Referring to FIG. 4H, the insulating layer 29 may be etched by a dry etch process to form a spacer 29a on the sidewall of the gate electrodes 26a. Subsequently, n type impurity ions are heavily implanted into the epitaxial layer 22 using a mask, including the sidewall spacer 29a, the gate electrode 26a and the insulating layer 24, to form a heavily doped n type impurity region 30. Since the insulating layer 24 is formed on the photodiode forming area, the photodiode forming area is not directly exposed in the process of forming the spacer on the sidewall of the gate electrodes 26a. Hence, the surface of the photodiode forming area can be protected.

Figure 4I:
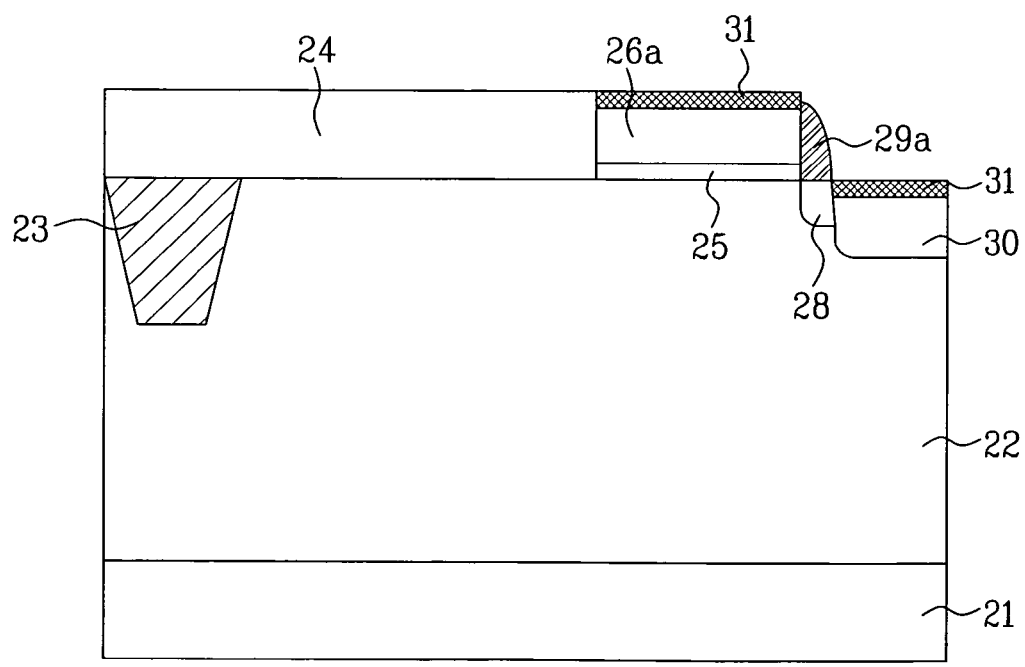

Referring to FIG. 4I, salicide 31 is formed on the exposed gate electrodes 26a and the epitaxial layer 22 of the active area. Hence, the salicide 31 can be uniformly formed on the gate electrode and the active area, except in an area of the photodiode area.

Figure 4J:
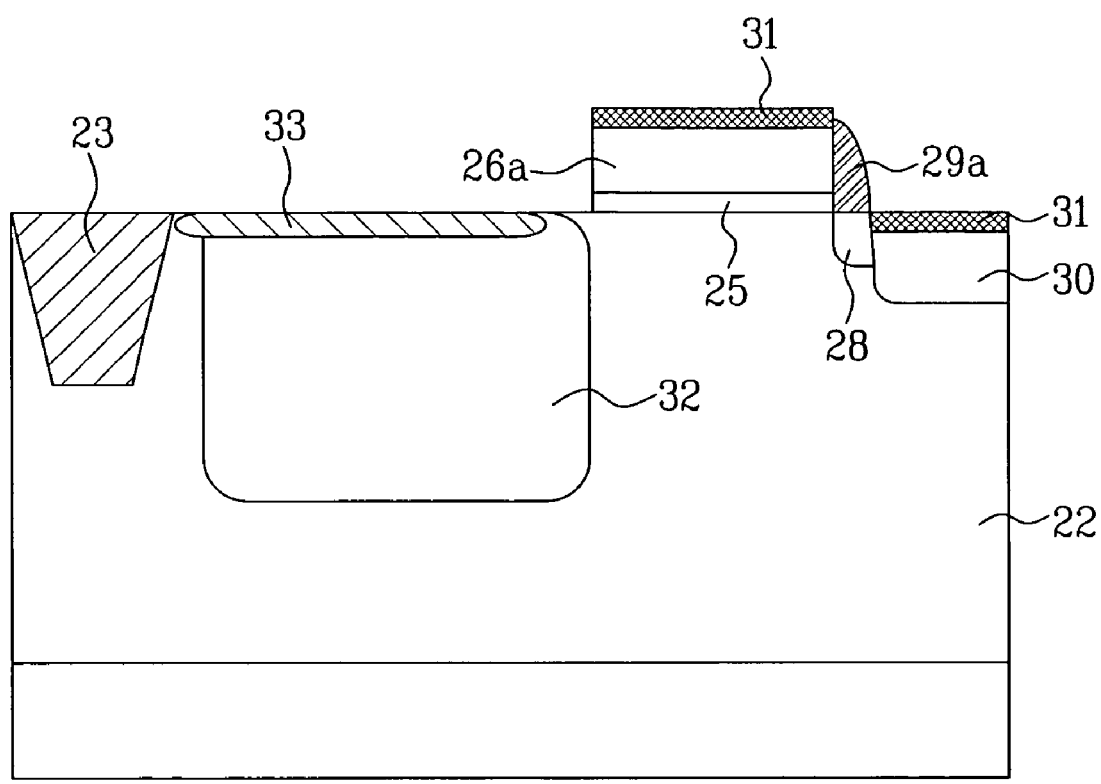

Referring to FIG. 4J, the insulating layer 24 is completely removed by a wet etch process. A photodiode n type impurity region 32 and a p type impurity region 33 on a surface of the n type impurity area 32 are formed by ion implantations using masks, respectively.

In an exemplary embodiment, the insulating layer is completely removed after completion of forming the salicide. Alternatively, the insulating layer can be completely removed after completion of forming the spacer. Alternatively, the insulating layer can be completely removed after completion of forming the gate electrode.

Accordingly, the present invention may provide the following effects or advantages.

Since the surface of the photodiode area can be protected in the process of etching the conductive layer, which may be polysilicon, to form the gate electrode, or can be protected in the process of forming the spacer on the sidewall of the gate electrode by the dry etch process, crystalline defects can be prevented from occurring on the surface of the photodiode area. Hence, the present invention can minimize the generation of the dark current.

Also, by minimizing the dark current generation, a low illumination intensity characteristic can be enhanced.

Furthermore, the present invention does not require a salicide blocking insulating layer depositing process, the masking process for salicidation, and the etch process for salicidation. Processing steps are thereby simplified.

Further, since salicidation is uniformly performed on the entire unit pixel area except the photodiode area, the contact resistance can be reduced and the process variation that may occur within a wafer can be minimized.

It will be apparent to those skilled in the art that various modifications and variations can be made in the present invention without departing from the spirit or scope of the invention. Thus, it is intended that the present invention cover the modifications and variation of this invention provided they come within the scope of the appended claims and their equivalents.

What is claimed is:

1. A method of fabricating a CMOS image sensor, comprising the steps of:
   forming an insulating layer on a first conductive type semiconductor substrate divided into a photodiode area and a transistor area;
   removing the insulating layer on a gate electrode forming area of the transistor area;
   forming a gate insulating layer on the gate electrode forming area of the semiconductor substrate;
   forming a conductive layer over the semiconductor substrate;
   forming a gate electrode by planarizing the conductive layer to expose a surface of the insulating layer;
   selectively removing the insulating layer to expose the semiconductor substrate;
   forming a second conductive type lightly doped impurity region in the exposed semiconductor substrate;
   forming a spacer on a sidewall of the gate electrode;
   completely removing the insulating layer; and
   forming a second conductive type heavily doped impurity region on the transistor area of the semiconductor substrate by ion implantation using a mask.

2. The method of claim 1, wherein in the step of selectively removing the insulating layer, the insulating layer on the transistor area is selectively removed.

3. The method of claim 1, wherein the insulating layer is formed of a TEOS based oxide layer.

4. The method of claim 1, wherein the gate insulating layer is formed by oxidation.

5. The method of claim 1, further comprising the step of forming a salicide on a surface of the gate electrode and an exposed epitaxial layer of an active area.

6. The method of claim 1, further comprising the step of forming a second conductive type impurity region and a first conductive type impurity region in the photodiode area by ion implantation using a mask.

7. A method of fabricating a CMOS image sensor, comprising the steps of:
   forming an insulating layer on a first conductive type semiconductor substrate divided into a photodiode area and a transistor area;
   removing the insulating layer on a gate electrode forming area of the transistor area;
   forming a gate insulating layer on the gate electrode forming area of the semiconductor substrate;
   forming a conductive layer over the semiconductor substrate;
   forming a gate electrode by planarizing the conductive layer to expose a surface of the insulating layer;
   selectively removing the insulating layer to expose the semiconductor substrate;

forming a second conductive type lightly doped impurity region in the exposed semiconductor substrate;

forming a spacer on a sidewall of the gate electrode;

forming a second conductive type heavily doped impurity region on the semiconductor substrate using the gate electrode and the spacer as a mask;

forming a salicide on a surface of the gate electrode and an exposed epitaxial layer of an active area; and completely removing the insulating layer.

8. The method of claim 7, wherein in the step of selectively removing the insulating layer, the insulating layer on the transistor area is selectively removed.

9. The method of claim 7, wherein the insulating layer is formed of a TEOS based oxide layer.

10. The method of claim 7, wherein the gate insulating layer is formed by oxidation.

11. The method of claim 7, further comprising the step of forming a second conductive type impurity region and a first conductive type impurity region in the photodiode area by ion implantation using a mask.

12. A method of fabricating a CMOS image sensor, comprising the steps of:

forming an insulating layer on a first conductive type semiconductor substrate divided into a photodiode area and a transistor area;

removing the insulating layer on a gate electrode forming area of the transistor area;

forming a gate insulating layer on the gate electrode forming area of the semiconductor substrate;

forming a conductive layer over the semiconductor substrate;

forming a gate electrode by planarizing the conductive layer to expose a surface of the insulating layer;

completely removing the insulating layer;

forming a second conductive type lightly doped impurity region on an exposed transistor area of the semiconductor substrate;

forming a spacer on a sidewall of the gate electrode;

forming a second conductive type heavily doped impurity region on the semiconductor substrate using the gate electrode and the spacer as a mask;

forming a salicide on a surface of the gate electrode and an exposed epitaxial layer of an active area; and forming a second conductive type impurity region and a first conductive type impurity region in the photodiode area by ion implantation using a mask.

* * * * *